(12) United States Patent
Ito

(10) Patent No.: US 11,257,751 B2
(45) Date of Patent: Feb. 22, 2022

(54) SEMICONDUCTOR DEVICE WITH STEP-LIKE WIRING LAYERS AND MANUFACTURING METHOD THEREOF

(71) Applicant: TOSHIBA MEMORY CORPORATION, Tokyo (JP)

(72) Inventor: Yoshinori Ito, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/557,351

(22) Filed: Aug. 30, 2019

(65) Prior Publication Data

US 2020/0294913 A1    Sep. 17, 2020

(30) Foreign Application Priority Data

Mar. 15, 2019 (JP) .............................. JP2019-048648

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76802* (2013.01); *H01L 21/76831* (2013.01); *H01L 21/76877* (2013.01); *H01L 23/5283* (2013.01)

(58) Field of Classification Search
CPC ........... H01L 23/5226; H01L 21/76802; H01L 21/76831; H01L 23/5283; H01L 21/76877; H01L 23/522; H01L 21/768; H01L 23/528; H01L 27/11582; H01L 21/76816; H01L 27/11575

USPC ......................................................... 257/734
See application file for complete search history.

(56) References Cited

U.S. PATENT DOCUMENTS

| 7,855,457 | B2 | 12/2010 | Mizukami et al. | |
|---|---|---|---|---|
| 8,581,323 | B2 | 11/2013 | Uenaka et al. | |
| 9,520,407 | B2 | 12/2016 | Fukuzumi et al. | |
| 2017/0154785 | A1 | 6/2017 | Yoshimizu et al. | |
| 2019/0013237 | A1* | 1/2019 | Nam | H01L 21/76816 |
| 2019/0074249 | A1* | 3/2019 | Sasaki | H01L 21/76805 |
| 2019/0206732 | A1* | 7/2019 | Chen | H01L 21/32053 |
| 2019/0273089 | A1* | 9/2019 | Yamamoto | H01L 23/53295 |
| 2019/0280004 | A1* | 9/2019 | Takamura | H01L 23/5226 |
| 2019/0341399 | A1* | 11/2019 | Tao | H01L 21/76877 |
| 2020/0027896 | A1* | 1/2020 | Eom | H01L 23/53266 |
| 2020/0035553 | A1* | 1/2020 | Yatsuda | H01L 27/11548 |
| 2020/0091064 | A1* | 3/2020 | Iwasaki | H01L 23/485 |
| 2020/0105735 | A1* | 4/2020 | Park | H01L 24/05 |

(Continued)

*Primary Examiner* — Alexander O Williams
(74) *Attorney, Agent, or Firm* — Foley & Lardner LLP

(57) ABSTRACT

A device includes: a substrate; a first wiring layer above the substrate; a second wiring layer above the first wiring layer; a first insulating film on the first and second wiring layers; a second insulating film in the first insulating film, provided at a position overlapping with a part of the first wiring layer and a part of the second wiring layer in a first direction perpendicular to a surface of the substrate, and including a first portion higher than an upper surface of an end portion of the second wiring layer and a second portion lower than the upper surface of the end portion of the second wiring layer; and a plug via the second insulating film in the first insulating film, provided on the upper surface of the end portion of the second wiring layer, and electrically connected to the second wiring layer.

11 Claims, 8 Drawing Sheets

(56) References Cited

U.S. PATENT DOCUMENTS

2020/0194456 A1* 6/2020 Baek .................. H01L 23/5283
2020/0303401 A1* 9/2020 Kanamori ......... H01L 27/11582

* cited by examiner

SEMICONDUCTOR DEVICE WITH STEP-LIKE WIRING LAYERS AND MANUFACTURING METHOD THEREOF

CROSS-REFERENCE TO RELATED APPLICATION

This application is based upon and claims the benefit of priority from Japanese Patent Application No. 2019-048648, filed Mar. 15, 2019, the entire contents of which are incorporated herein by reference.

FIELD

Embodiments described herein relate generally to a semiconductor device and a manufacturing method thereof.

BACKGROUND

When forming a contact hole or a via hole on a wiring, the hole may not reach the wiring or the hole may reach another wiring. In such a case, the contact plug or via plug becomes defective.

DETAILED DESCRIPTION

Figure 1:
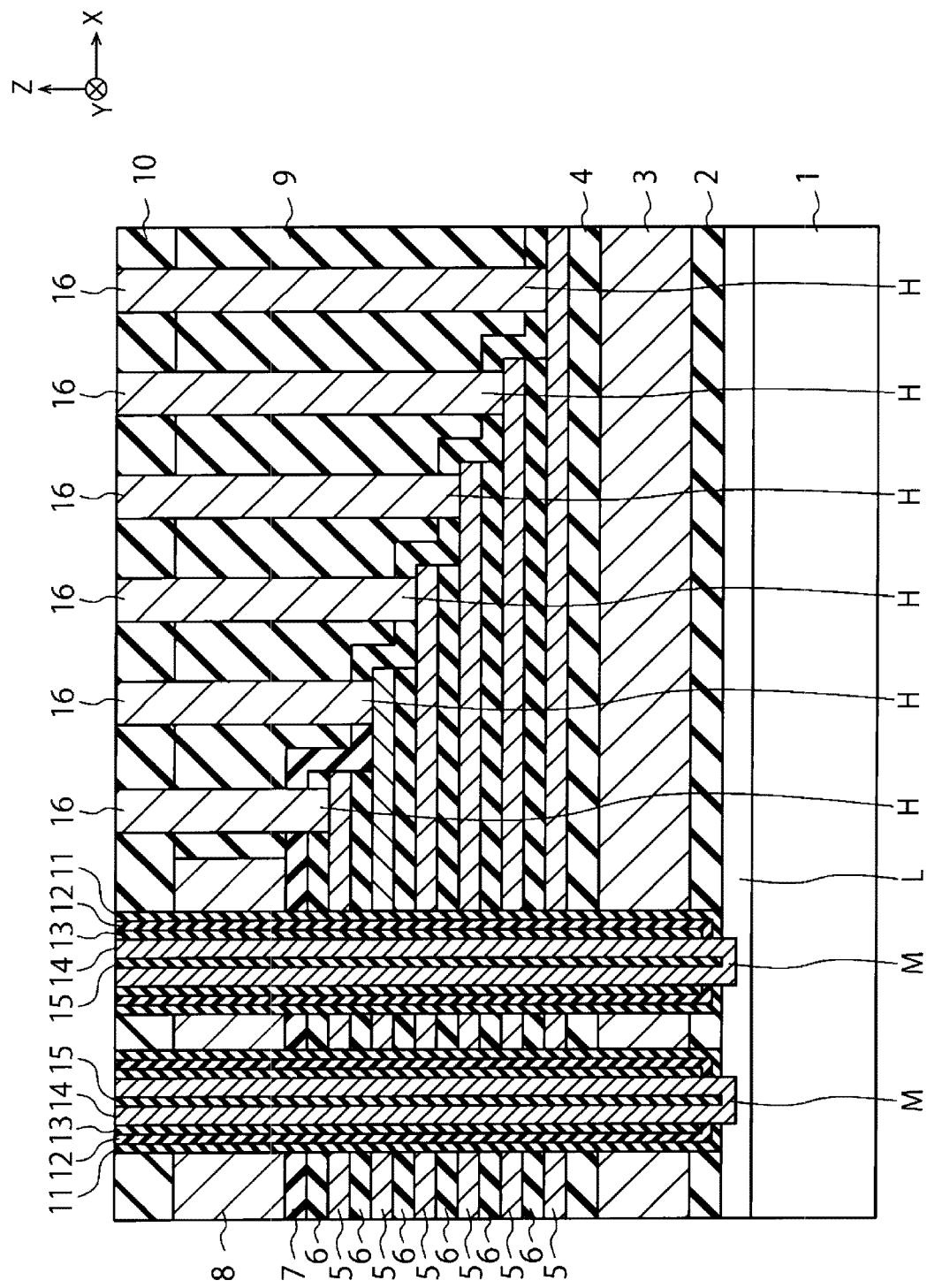
FIG. 1 is a cross-sectional view illustrating a structure of a semiconductor device according to a first embodiment.

Embodiments provide a semiconductor device capable of reducing plug defects and a method of manufacturing the semiconductor device.

In general, according to one embodiment, the semiconductor device includes: a substrate; a first wiring layer, provided above the substrate, that extends along a first direction; and a second wiring layer, provided above the first wiring layer, that extends along the first direction. The first wiring layer includes an extended portion extending beyond an end portion of the second wiring layer along the first direction. Also, the device further includes: a first insulating film provided on the first and second wiring layers; and a second insulating film, extending into the first insulating film, that includes a first portion above an upper surface of the end portion of the second wiring layer and a second portion below the upper surface of the end portion of the second wiring layer. The device further includes: a plug extending into the first insulating film, that is electrically connected to the second wiring layer.

Hereinafter, embodiments of the present disclosure will be described with reference to the accompanying drawings. In FIG. 1 to FIGS. 10A and 10B, the same or similar configurations are denoted by the same reference numerals, and redundant descriptions thereof will be omitted.

First Embodiment

FIG. 1 is a cross-sectional view illustrating a structure of a semiconductor device according to a first embodiment. The semiconductor device of FIG. 1 includes a three-dimensional memory.

The semiconductor device of FIG. 1 includes a substrate 1, a first interlayer insulating film 2, a source-side conductive layer 3, a second interlayer insulating film 4, a plurality of wiring layers 5, a plurality of insulating layers 6, a cover insulating film, a drain-side conductive layer 8, a third interlayer insulating film 9, a fourth interlayer insulating film 10, a block insulating film 11, a charge storage layer 12, a tunnel insulating film 13, a channel semiconductor layer 14, a core insulating film 15, and a plurality of contact plugs 16.

The substrate 1 is, for example, a semiconductor substrate such as a silicon substrate. FIG. 1 illustrates an X direction and a Y direction which is parallel to or perpendicular to the surface of the substrate 1, and a Z direction which is perpendicular to the surface of the substrate 1. In the present specification, a +Z direction is treated as an upward direction, and a −Z direction is treated as a downward direction. The −Z direction may or may not coincide with a gravity direction.

The first interlayer insulating film 2 is formed on a diffusion layer L formed in the substrate 1. The source-side conductive layer 3 is formed on the first interlayer insulating film 2. The second interlayer insulating film 4 is formed on the source-side conductive layer 3.

The plurality of wiring layers 5 and the plurality of insulating layers 6 are alternately stacked on the second interlayer insulating film 4. Each wiring layer 5 is formed of, for example, a barrier metal layer such as a titanium nitride film and a wiring material layer such as a tungsten layer, and functions as a word line or a select line. The number of the wiring layers 5 is, for example, more than or equal to 64. Each insulating layer 6 is, for example, a silicon oxide film. The number of the insulating layers 6 is, for example, more than or equal to 64. FIG. 1 illustrates a plurality of memory holes M which penetrate through the wiring layer 5 and the insulating layer 6, and a plurality of contact holes H which are formed on the staircase (or step-like) region of the wiring layer 5 and the insulating layer 6.

The cover insulating film 7 is formed on the wiring layer 5 and the insulating layer 6. The drain-side conductive layer 8 is formed on the cover insulating film 7 so as to be adjacent to the staircase region. The third interlayer insulating film 9 is formed on the cover insulating film 7 so as to fill the space on the staircase region. The fourth interlayer insulating film 10 is formed on the drain-side conductive layer 8 and the third interlayer insulating film 9.

The block insulating film 11, the charge storage layer 12, and the tunnel insulating film 13 are sequentially formed on the side surface of the memory hole M which penetrates through a first interlayer insulating film 2, a source-side conductive layer 3, a second interlayer insulating film 4, a wiring layer 5, an insulating layer 6, a cover insulating film 7, a drain-side conductive layer 8, and a fourth interlayer insulating film 10. The block insulating film 11 is, for example, a silicon oxide film. The charge storage layer 12 is, for example, a silicon nitride film. The tunnel insulating film 13 is, for example, a silicon oxide film. Meanwhile, the charge storage layer 12 may be a semiconductor layer such as a polysilicon layer.

The channel semiconductor layer 14 and the core insulating film 15 are sequentially formed in the memory hole M via the block insulating film 11, the charge storage layer 12, and the tunnel insulating film 13. The channel semiconductor layer 14 is, for example, a polysilicon layer and is electrically connected to the substrate 1. The core insulating film 15 is, for example, a silicon oxide film.

These layers in the memory hole M are formed, for example, as follows. First, the block insulating film 11, the charge storage layer 12, and the tunnel insulating film 13 are sequentially formed on the side and bottom surfaces of the memory hole M. Next, the tunnel insulating film 13, the charge storage layer 12, and the block insulating film 11 are removed from the bottom surface of the memory hole M. Next, the channel semiconductor layer 14 and the core insulating film 15 are sequentially formed in the memory hole M. In this manner, a plurality of memory cells are formed in each memory hole M.

The plurality of contact plugs 16 are formed in the plurality of contact holes H which penetrate through the cover insulating film 7, the third interlayer insulating film 9, and the fourth interlayer insulating film 10. These contact plugs 16 are electrically connected to different wiring layers 5. Each of the contact plugs 16 is formed of, for example, a barrier metal layer such as a titanium nitride film and a plug material layer such as a tungsten layer.

Figure 2:
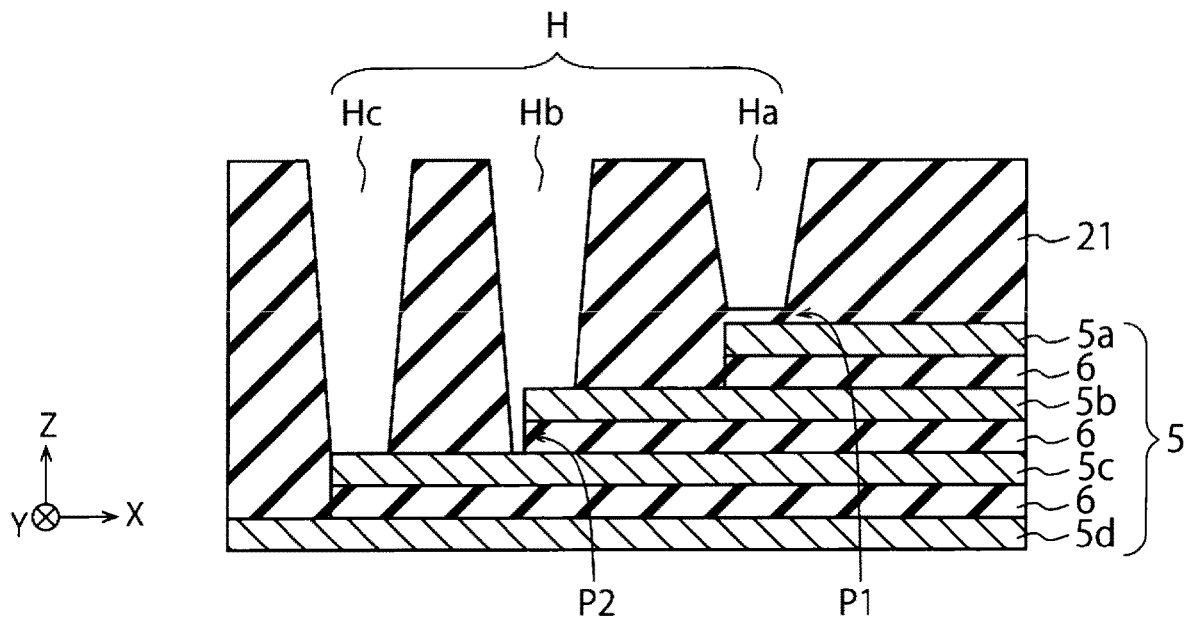
FIG. 2 is a cross-sectional view illustrating a process of manufacturing a semiconductor device related to the problem to be solved by the first embodiment.

FIG. 2 is a cross-sectional view illustrating a process of manufacturing a semiconductor device related to the problem to be solved by the first embodiment.

FIG. 2 illustrates a cross section immediately after forming a plurality of contact holes H on the staircase region of the wiring layer 5 and the insulating layer 6. However, the direction of the staircase region in FIG. 2 is described as being opposite to the direction of the staircase region in FIG. 1. The shape of each contact hole H is non-tapered in FIG. 1. Alternatively, the shape of each contact hole H may be tapered as illustrated in FIG. 2. Further, the interlayer insulating film 21 illustrated in FIG. 2 corresponds to the cover insulating film 7, the third interlayer insulating film 9, and the fourth interlayer insulating film 10 as described above. The interlayer insulating film 21 is an example of the first insulating film.

FIG. 2 illustrates four wiring layers 5a, 5b, 5c, and 5d, which can be the wiring layer 5, and three contact holes Ha, Hb, and Hc, which can be the contact hole H. The wiring layers 5a to 5d are formed in the order of the wiring layers 5d, 5c, 5b, and 5a above the substrate 1 described above. Further, the contact holes Ha, Hb, and Hc are formed at positions extending toward the wiring layers 5a, 5b, and 5c, respectively.

Here, defects indicated by reference numerals P1 and P2 occur in these contact holes H. The reference numeral P1 indicates a defect (hereinafter "defect P1") in which the contact hole Ha has not reached the wiring layer 5a. When the contact plug 16 is formed in the contact hole Ha, an open defect occurs. Meanwhile, the reference numeral P2 indicates a defect (hereinafter "defect P2") that the contact hole Hb is formed at a position protruding from the upper surface of the wiring layer 5b, and the contact hole Hb reaches the wiring layer 5c as well as the wiring layer 5b. When the contact plug 16 is formed in the contact hole Hb, a leak failure occurs.

In general, when the hole diameter of the contact hole His set to be small, the defect P1 is likely to occur. However, when the hole diameter of the contact hole H is set to be large in order to prevent the defect P1, the defect P2 is likely to occur. Therefore, a method capable of preventing both defects is required.

Figure 3:
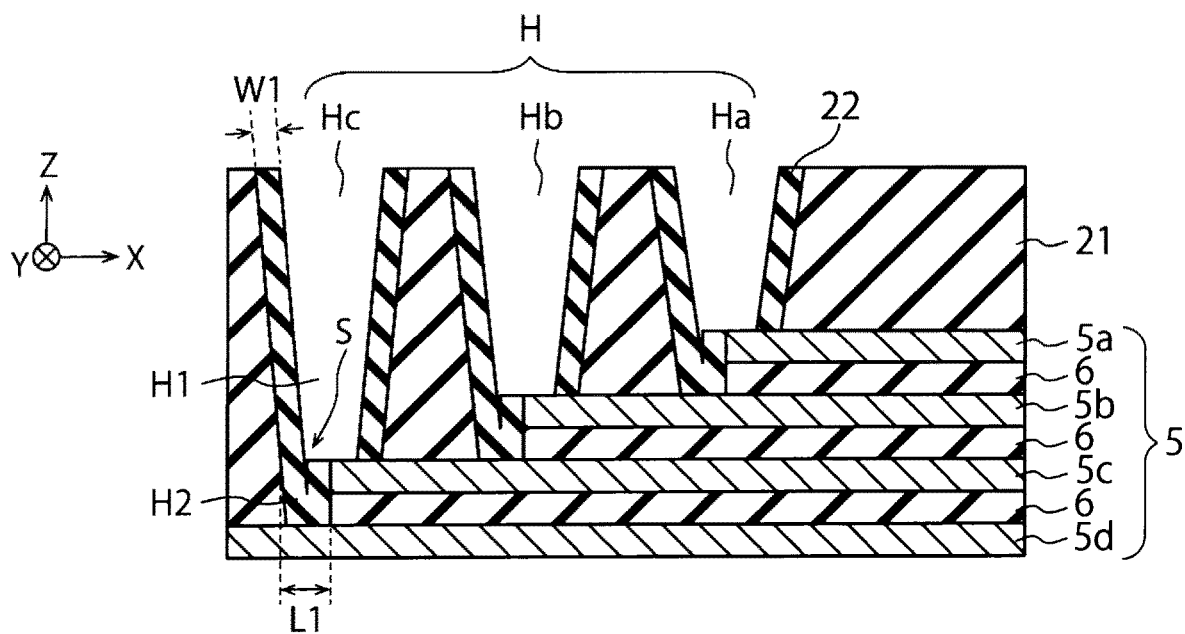
FIG. 3 is a cross-sectional view illustrating a process of manufacturing the semiconductor device according to the first embodiment.

FIG. 3 is a cross-sectional view illustrating a process of manufacturing the semiconductor device according to the first embodiment.

FIG. 3 illustrates a cross section immediately after forming the plurality of contact holes H on the staircase region of the wiring layer 5 and the insulating layer 6 and then forming the insulating film 22 in the contact holes H. The insulating film 22 is an example of a second insulating film.

In the present embodiment, the hole diameter of the contact hole H is set to be large. Thus, although the defect P1 (FIG. 2) may be prevented, the defect P2 may still occur. However, according to the present embodiment, it is possible to resolve the issue of forming the defect P2 by forming the insulating film 22 in the contact hole H. Hereinafter, the details of the contact hole H will be described by taking the contact hole Hc as an example.

The contact hole Hc is formed at a position overlapping with the wiring layer 5c and the wiring layer 5d in the Z direction. That is, the contact hole Hc is located right above the wiring layer 5c and the wiring layer 5d. Therefore, the contact hole Hc reaches not only the wiring layer 5c but also the wiring layer 5d. The contact hole Hc is located right above the end portion of the wiring layer 5c and right above a portion other than the end portion of the wiring layer 5d. As a result, the contact hole Hc includes a first region H1 provided at a position higher than the upper surface of the end portion of the wiring layer 5c, and a second region H2 provided at a position lower than the upper surface of the end portion of the wiring layer 5c. When the contact plug 16 is formed in the second region H2 and the contact plug 16 contacts the wiring layer 5d, a leak failure occurs.

Therefore, in the present embodiment, the insulating film 22 is formed in the contact hole Hc, and at least a part of the second region H2 is embedded with the insulating film 22. Then, after the insulating film 22 is removed from the upper surface of the end portion of the wiring layer 5c, the contact plug 16 is formed in the contact hole Hc. Thus, the contact plug 16 may be electrically connected to the wiring layer 5c and electrically insulated from the wiring layer 5d. FIG. 3 illustrates a cross section immediately after removing the insulating film 22 from the upper surface of the end portion of the wiring layer 5c. As described above, according to the present embodiment, the leakage failure may be prevented by forming the insulating film 22 in the contact hole Hc. The wiring layers 5d and 5c are examples of the first and second wiring layers, respectively.

The insulating film 22 in the contact hole Hc includes a portion located in the first region H1 (first portion) and a portion located in the second region H2 (second portion). The first portion of the insulating film 22 is formed on the side surface of the interlayer insulating film 21 in the first region H1 of the contact hole Hc. The second portion of the insulating film 22 is formed on the side surface of the interlayer insulating film 21, the side surface of the wiring layer 5c or the insulating layer 6 thereunder, or the upper surface of the wiring layer 5d in the second region H2 of the contact hole Hc. The first portion of the insulating film 22 is provided at a position overlapping with the wiring layer 5c and the wiring layer 5d in the Z direction, and the second portion of the insulating film 22 is provided at a position overlapping with the wiring layer 5d in the Z direction. Since the contact hole Hc in the present embodiment reaches the wiring layer 5d, the second portion of the insulating film 22 is in contact with the upper surface of the wiring layer 5d.

FIG. 3 illustrates a film thickness W1 of the insulating film 22 and a width L1 of the second portion of the insulating film 22 at the height of the upper surface of the end portion of the wiring layer 5c. The width L1 in FIG. 3 corresponds to the distance in the X direction between the end portion of the wiring layer 5c and the side surface of the contact hole Hc. In the present embodiment, it is desirable to set the film thickness W1 to a half or more of the width L1 (W1≥L1/2). When the film thickness W1 is set to a half or more of the width L1, the entire second region H2 may be embedded with the insulating film 22. FIG. 3 illustrates a state in which almost the entire second region H2 is filled with the insulating film 22. FIG. 3 illustrates a seam S which remains on the upper surface of the insulating film 22 in the second region H2.

FIGS. 4A, 4B, 5A, and 5B are cross-sectional views illustrating a method of manufacturing the semiconductor device according to the first embodiment.

Figure 4A:
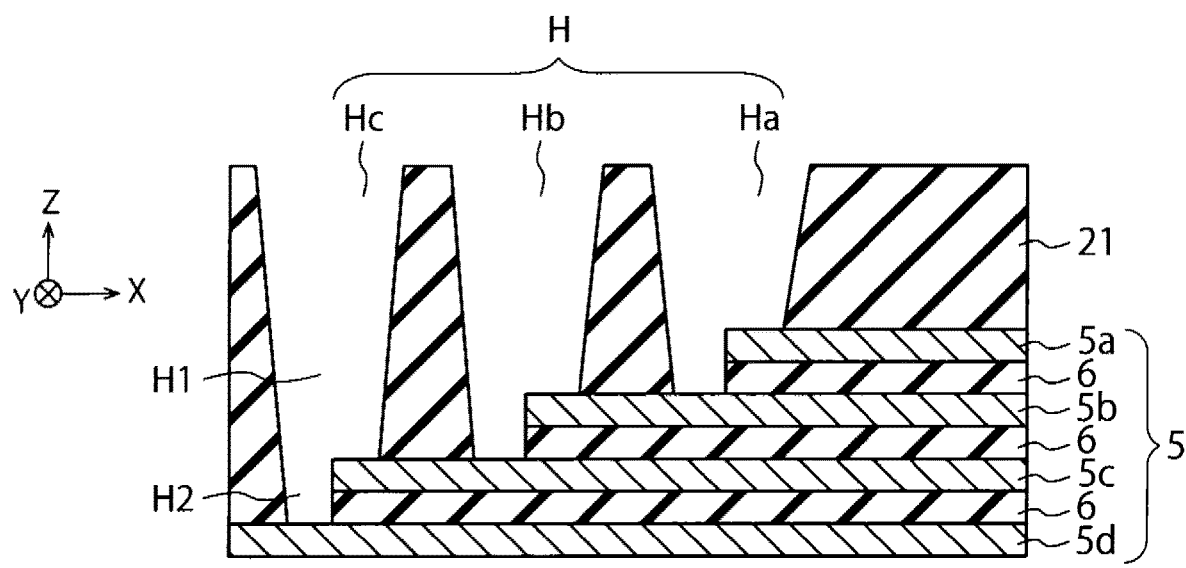
FIGS. 4A and 4B are cross-sectional views (1/2) illustrating a method of manufacturing the semiconductor device according to the first embodiment.

First, as illustrated in FIG. 1, after a first interlayer insulating film 2, a source-side conductive layer 3, and a second interlayer insulating film 4 are sequentially formed on the substrate 1, a plurality of wiring layers 5 and a plurality of insulating layers 6 are alternately formed on the second interlayer insulating film 4 (FIG. 4A). Next, the staircase region of the wiring layer 5 and the insulating layer 6 is formed, the interlayer insulating film 21 is formed on the wiring layer 5 and the insulating layer 6, and a plurality of contact holes H are formed in the interlayer insulating film 21 by etching (FIG. 4A). The interlayer insulating film 21 is formed by, for example, application of a coating solution which serves as a material of the interlayer insulating film 21.

The wiring layer 5 may be formed by, for example, the following replacement process. First, a plurality of sacrificial layers and a plurality of insulating layers 6 are alternately formed on the second interlayer insulating film 4. Each sacrificial layer is, for example, a silicon nitride film. Next, the sacrificial layer is removed by wet etching to form a plurality of cavities between the insulating layers 6. Next, the wiring layer 5 is formed in these cavities. Thus, a stacked film that alternately includes the plurality of wiring layers 5 and the plurality of insulating layers 6 is formed on the second interlayer insulating film 4.

FIG. 4A illustrates the wiring layers 5a to 5d and the contact holes Ha to Hc, as shown in FIG. 3. Each of the contact holes Ha to Hc reaches not only the corresponding wiring layer (e.g., the contact hole Ha corresponding to the wiring layer 5a; the contact hole Hb corresponding to the wiring layer 5b; and the contact hole Hc corresponding to the wiring layer 5c), but also the wiring layer one wiring layer below the corresponding wiring layer (e.g., the contact hole Ha also reaching the wiring layer 5b; the contact hole Hb also reaching the wiring layer 5c; and the contact hole Hc also reaching the wiring layer 5d). Therefore, when the contact plug 16 is formed in the contact holes Ha to Hc, a leak failure occurs. Therefore, in the subsequent processes, the method described in FIG. 3 is adopted.

Figure 4B:
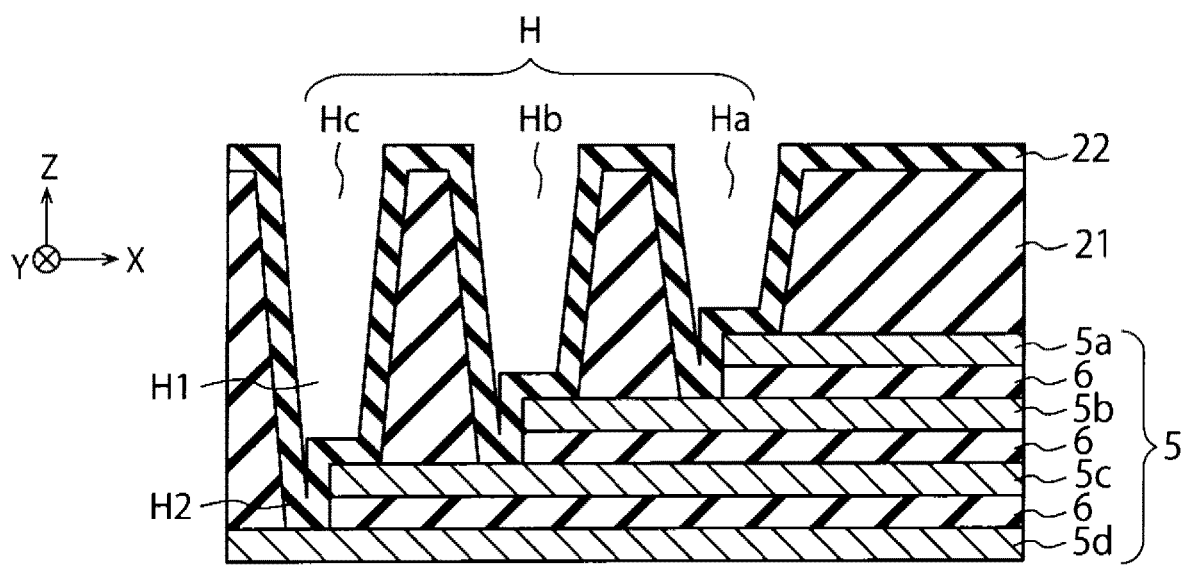

Next, the insulating film 22 is formed on the entire surface of the substrate 1 (FIG. 4B). As a result, the insulating film 22 is formed in the contact hole H. The insulating film 22 is, for example, a silicon oxide film. The insulating film 22 may be formed of the same insulating material as at least a part of the interlayer insulating film 21, or may be formed of an insulating material different from the interlayer insulating film 21. Since the insulating film 22 of the present embodiment is formed conformally in the contact hole H, the surface of the contact hole H is covered with the insulating film 22 and the central portion of the contact hole H remains hollow. The insulating film 22 is formed by, for example, a chemical vapor deposition (CVD).

FIG. 4B illustrates the first region H1 and the second region H2 of the contact hole Hc as in FIG. 3. In the process of FIG. 4B, it is desirable to set the film thickness W1 of the insulating film 22 to a half or more of the above-described width L1 (see FIG. 3). Thus, the entire second region H2 may be embedded with the insulating film 22. The same applies to the other contact holes Ha and Hb.

Figure 5A:
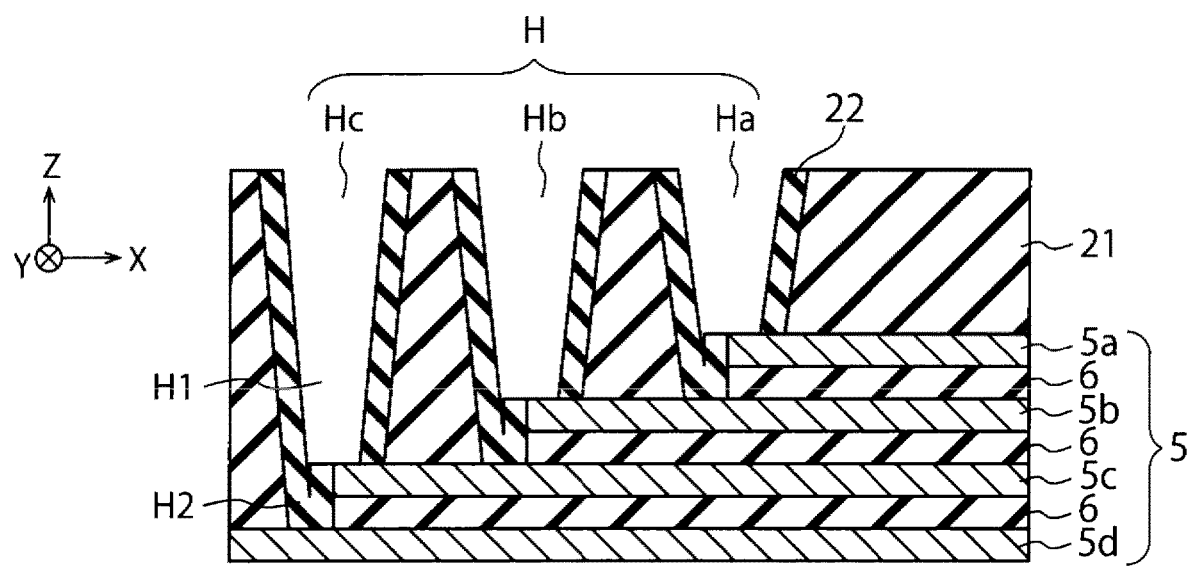
FIGS. 5A and 5B are cross-sectional views (2/2) illustrating a method of manufacturing the semiconductor device according to the first embodiment.

Next, the insulating film 22 is removed from the upper surfaces of the end portions of the wiring layers 5a to 5c (FIG. 5A). Thus, the upper surfaces of the end portions of the wiring layers 5a to 5c are exposed in the contact holes Ha to Hc. The insulating film 22 is removed by, for example, a reactive ion etching (RIE).

Figure 5B:
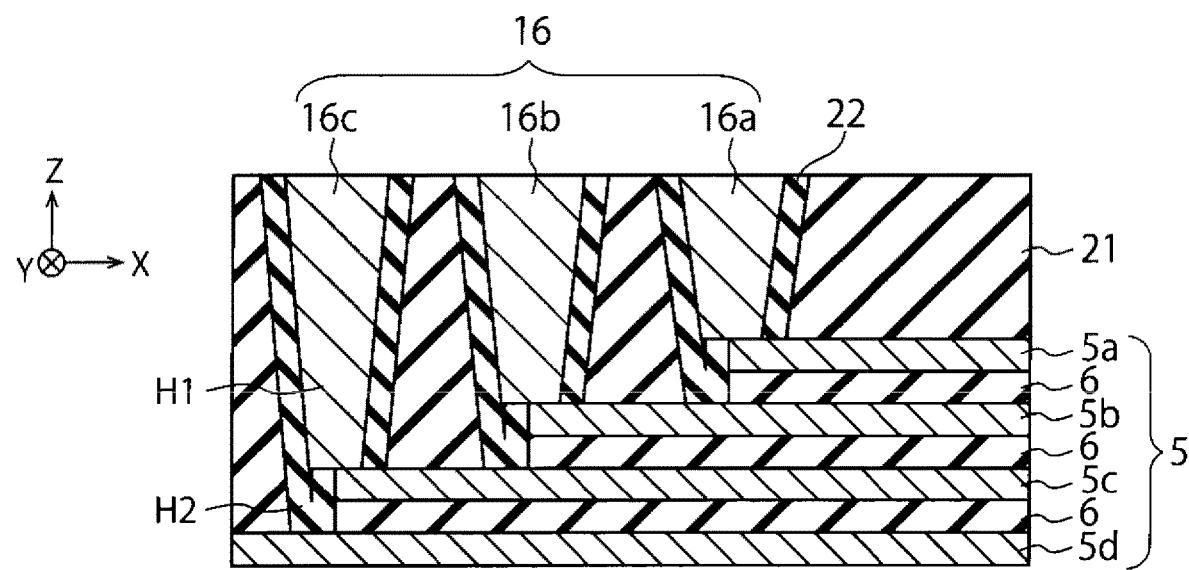

Next, the contact plug 16 is formed in the contact hole H (FIG. 5B). FIG. 5B illustrates contact plugs 16a to 16c which are formed in the contact holes Ha to Hc, respectively, via the insulating film 22. The contact plugs 16a to 16c are respectively formed on the upper surfaces of the end portions of the wiring layers 5a to 5c, and are electrically connected to the wiring layers 5a to 5c. Further, the contact plugs 16a to 16c are electrically insulated from the wiring layers 5b to 5d, respectively, by the insulating film 22.

Thereafter, various wiring layers and interlayer insulating films are formed on the substrate 1. Thus, the semiconductor device of FIG. 1 is manufactured.

As described above, in the process of FIG. 4A, the contact holes Ha to Hc reach not only the wiring layers 5a to 5c but also the wiring layers 5b to 5d. Such a structure may be implemented by, for example, the following two aspects. Hereinafter, these aspects will be described by taking the contact hole Hc as an example.

In the first aspect, the contact hole Hc is intentionally formed right above the wiring layers 5c and 5d in the process of FIG. 4A. In this case, after the contact hole Hc is formed, the insulating film 22 is formed in the contact hole Hc (FIG. 4B). As a result, the contact plug 16 in the contact hole Hc may be prevented from being electrically connected to the wiring layer 5d.

In the second aspect, the contact holes Hc are unintentionally formed right above the wiring layers 5c and 5d in the process of FIG. 4A. In this case, it is desirable to inspect whether the contact hole Hc has reached the wiring layer 5d after the formation of the contact hole Hc. Then, when the inspection result that the contact hole Hc has reached the wiring layer 5d is obtained, the insulating film 22 is formed in the contact hole Hc (FIG. 4B). As a result, the contact plug 16 in the contact hole Hc may be prevented from being electrically connected to the wiring layer 5d. Such an inspection may be implemented by, for example, confirming whether the contact hole Hc has reached the wiring layer 5d using a scanning electron microscope (SEM) image of the contact hole Hc.

Figure 6:
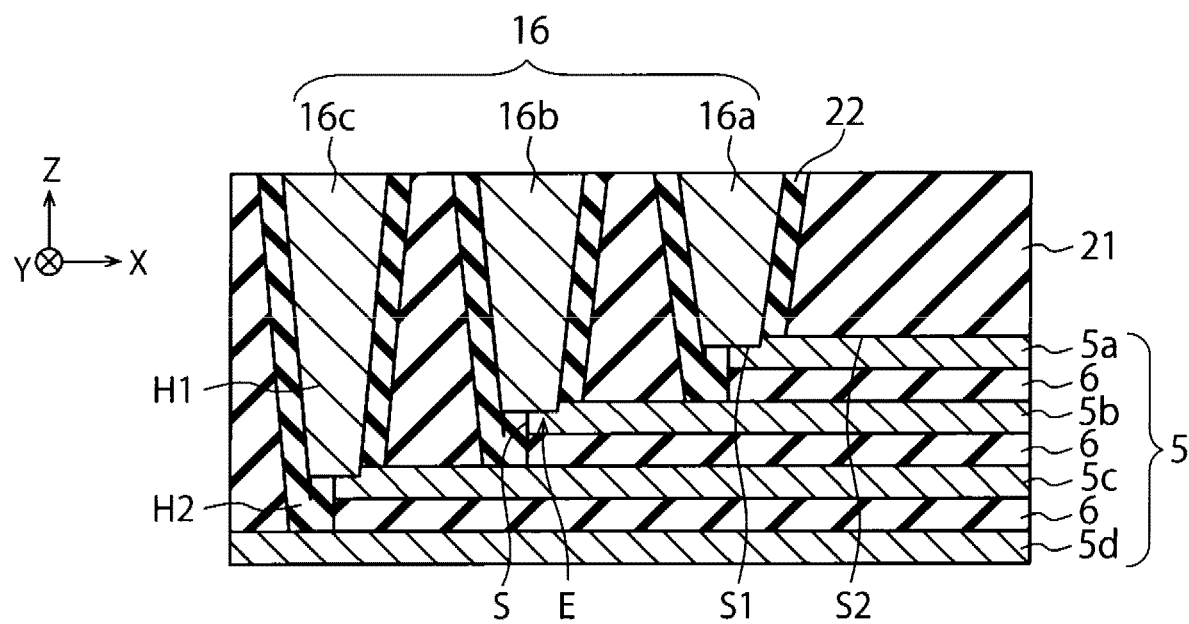
FIG. 6 is a cross-sectional view illustrating the details of the structure of the semiconductor device according to the first embodiment.

FIG. 6 is a cross-sectional view illustrating the details of the structure of the semiconductor device according to the first embodiment.

FIG. 6 illustrates the end portion E of the wiring layers 5a to 5c and the side surface S of the end portion E. The upper surface of each of the wiring layers 5a to 5c includes a first upper surface 51 which is an upper surface of the end portion E, and a second upper surface S2 which is another upper surface. In the process of FIG. 5B, when the insulating film 22 is removed by the RIE, the upper surface of the end portion E may be recessed by over-etching. FIG. 6 illustrates a state in which the upper surface of the end portion E is recessed. Therefore, the first upper surface 51 is located at a position lower than the second upper surface S2.

The side surface S of each of the wiring layers 5a to 5c is covered with the insulating film 22. The upper surface of the insulating film 22 is recessed by over-etching with the upper surface of the end portion E.

As described above, in the present embodiment, the contact plug 16 is formed in the contact hole H via the insulating film 22. Therefore, according to the present embodiment, it is possible to reduce defects of the contact plug 16 such as open defects and leak defects.

Second Embodiment

Figure 7:
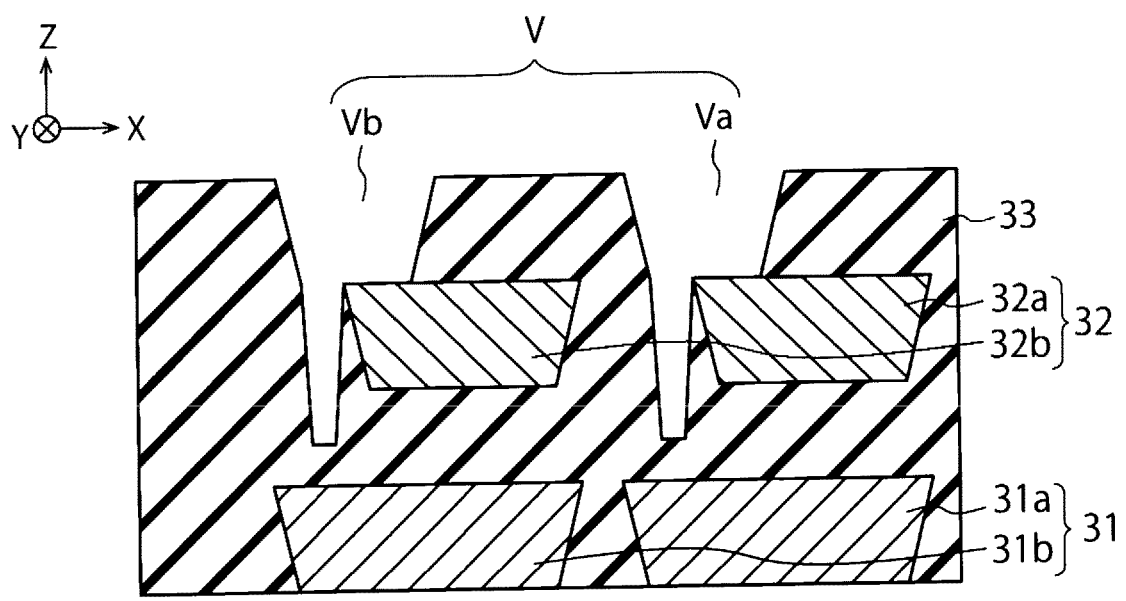
FIG. 7 is a cross-sectional view illustrating a process of manufacturing a semiconductor device related to the problem to be solved by the second embodiment.

FIG. 7 is a cross-sectional view illustrating a process of manufacturing a semiconductor device related to the problem to be solved by the second embodiment.

FIG. 7 illustrates a wiring layer 31 formed above the substrate 1 described above, a wiring layer 32 formed above the wiring layer 31, and an interlayer insulating film 33 formed on the wiring layers 31 and 32. The wiring layers 31 and 32 are, for example, metal layers, and the interlayer insulating film 33 is, for example, a silicon oxide film. The wiring layer 31 is an example of a first wiring layer, the wiring layer 32 is an example of a second wiring layer, and the interlayer insulating film 33 is an example of a first insulating film.

FIG. 7 illustrates two wirings 31a and 31b in the wiring layer 31, and two wirings 32a and 32b in the wiring layer 32. All of the wirings 31a, 31b, 32a, and 32b extend in the Y direction, although they may extend in the other direction. For example, the wirings 31a and 31b may extend in the X direction, and the wirings 32a and 32b may extend in the Y direction.

FIG. 7 illustrates a cross section immediately after forming a plurality of via holes V for the wiring layer 32 in the interlayer insulating film 33. These via holes V include a via hole Va for a wiring 32a and a via hole Vb for a wiring 32b.

Also, with respect to these via holes V, the same defects as those of the contact holes H described above may occur. In FIG. 7, the via hole Va is formed at a position protruding from the upper surface of the wiring 32a, and a part of the via hole Va extends toward the wiring layer 31. Further, the upper surface of the wiring 31a is present immediately below the part of the via hole Va. Thus, there is a possibility that the part of the via hole Va may reach the wiring 31a. When the via hole Va reaches the wiring 31a, a leak failure occurs in the via plug in the via hole Va. In addition, even when the via hole Va does not reach the wiring 31a, when the via hole Va extends to the vicinity of the upper surface of the wiring 31a, insufficient withstand voltage occurs at the bottom of the via plug in the via hole Va. The same applies to the via hole Vb.

Figure 8:
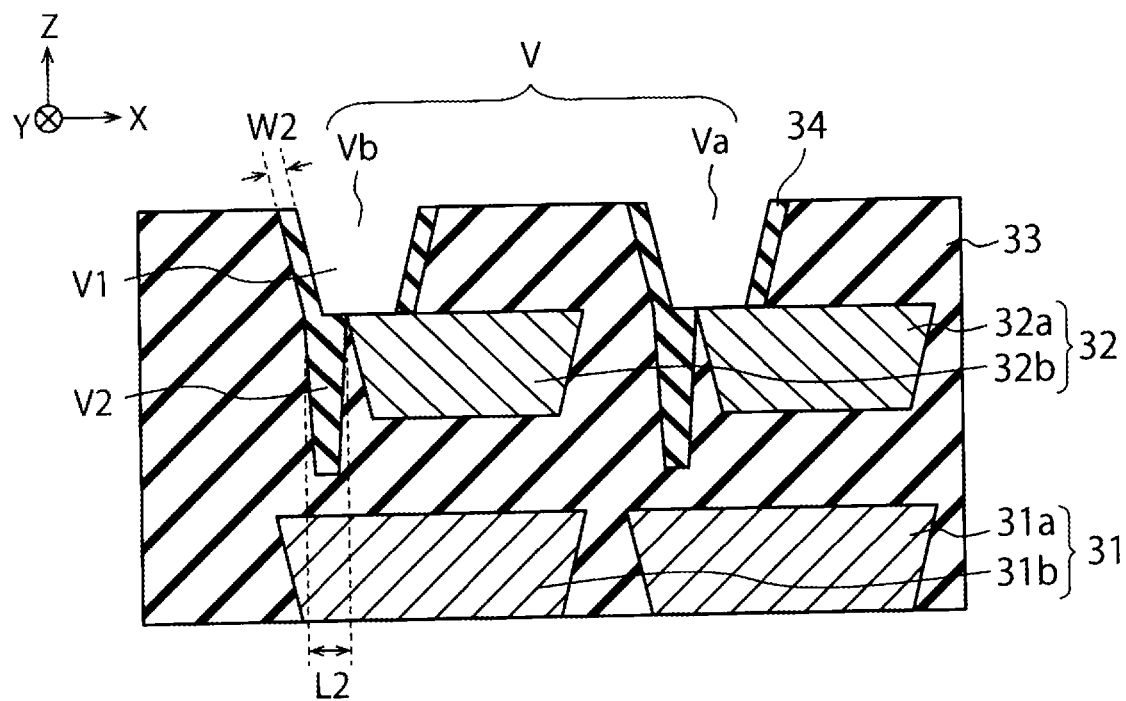
FIG. 8 is a cross-sectional view illustrating a process of manufacturing the semiconductor device according to the second embodiment.

FIG. 8 is a cross-sectional view illustrating a process of manufacturing the semiconductor device according to the second embodiment.

FIG. 8 illustrates a cross section immediately after forming the insulating film 34 in the via hole V after forming the via hole V in the interlayer insulating film 33. The insulating film 34 is, for example, a silicon oxide film. The insulating film 34 is an example of a second insulating film.

In the present embodiment, the hole diameter of the via hole V is set to be large. As a result, the open defect of the via plug in the via hole V may be prevented, although there is a possibility that the leak defect of the via plug in the via hole V or the insufficient withstand voltage at the bottom of the via plug in the via hole Va may occur. However, according to the present embodiment, these problems may be solved by forming the insulating film 34 in the via hole H. Hereinafter, the details of the via hole V will be described by taking the via hole Vb as an example.

The via hole Vb is formed at a position overlapping with the wiring 32b and the wiring 31b in the Z direction. That is, the via hole Vb is located immediately above the wiring 32b and the wiring 31b. Therefore, the via hole Vb extends to the vicinity of the upper surface of the wiring 31b. The via hole Vb is located right above the end portion of the wiring 32b and right above a portion other than the end portion of the wiring 31b. As a result, the via hole Vb includes a first region V1 provided at a position higher than the upper surface of the end portion of the wiring 32b, and a second region V2 provided at a position lower than the upper surface of the end portion of the wiring 32b. When a via plug is formed in the second region V2, insufficient withstand voltage occurs.

Therefore, in the present embodiment, the insulating film 34 is formed in the via hole Vb, and at least a part of the second region V2 is embedded with the insulating film 34. Further, after the insulating film 34 is removed from the upper surface of the end portion of the wiring 32b, a via plug is formed in the via hole Vb. Thus, the via plug may be electrically connected to the wiring 32b and electrically isolated from the wiring 31b. FIG. 8 illustrates a cross section immediately after removing the insulating film 34 from the upper surface of the end portion of the wiring 32b. As described above, according to the present embodiment, it is possible to prevent a leak failure and an insufficient withstand voltage by forming the insulating film 34 in the via hole Vb.

The insulating film 34 in the via hole Vb includes a portion located in the first region V1 (first portion) and a portion located in the second region V2 (second portion). The first portion of the insulating film 34 is formed on the side surface of the interlayer insulating film 33 in the first region V1 of the via hole Vb. The second portion of the insulating film 34 is formed on the side surface of the interlayer insulating film 33 in the second region V2 of the via hole Vb. The first portion of the insulating film 34 is provided at a position overlapping with the wiring 32b and the wiring 31b in the Z direction, and the second portion of the insulating film 34 is provided at a position overlapping with the wiring 31b in the Z direction.

FIG. 8 illustrates a film thickness W2 of the insulating film 34 and a width L2 of the second portion of the insulating film 34 in the height of the upper surface of the end portion of the wiring 32b. The width L2 in FIG. 8 corresponds to the distance in the X direction between the end portion of the wiring 32b and the side surface of the via hole Vb. In the present embodiment, it is desirable to set the film thickness W2 to a half or more of the width L2 (W2≥L2/2). When the film thickness W2 is set to a half or more of the width L2, the entire second region V2 may be embedded with the insulating film 34. FIG. 8 illustrates a state in which the entire second region V2 is embedded with the insulating film 34.

FIGS. 9A, 9B, 10A and 10B are cross-sectional views illustrating a method of manufacturing the semiconductor device according to the second embodiment.

Figure 9A:
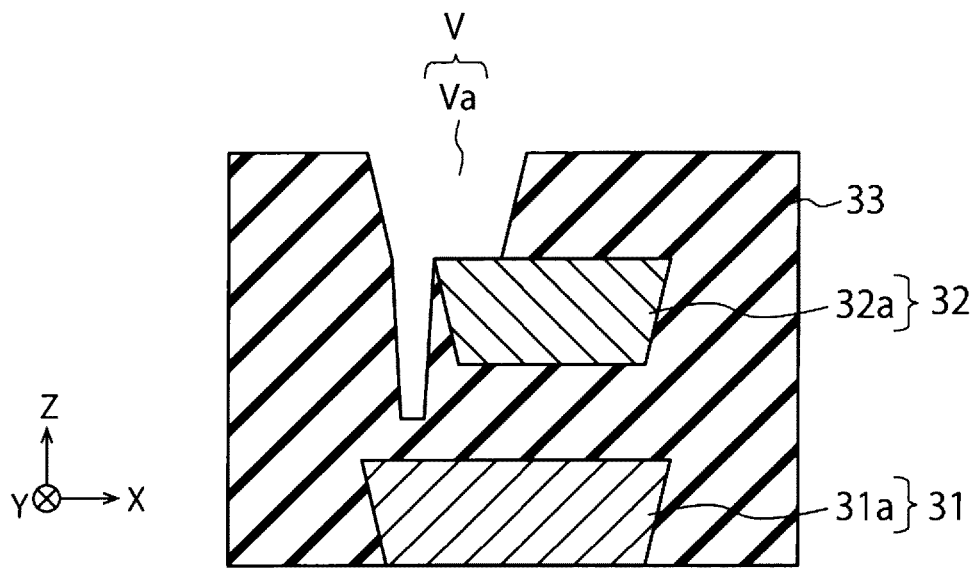
FIGS. 9A and 9B are cross-sectional views (1/2) illustrating a method of manufacturing the semiconductor device according to the second embodiment.

First, the wiring layer 31 is formed above the substrate 1 described above, and the wiring layer 32 is formed above the wiring layer 31 (FIG. 9A). The interlayer insulating film 33 is formed in parallel with the process of forming the wiring layers 31 and 32, or after the formation of the wiring layers 31 and 32. As a result, an interlayer insulating film 33 covering the wiring layers 31 and 32 is formed. Next, a plurality of via holes V (FIG. 9A illustrates only the via holes Va) are formed in the interlayer insulating film 33 by etching (FIG. 9A). The interlayer insulating film 33 is formed by, for example, application of a coating solution which serves as a material of the interlayer insulating film 33.

Figure 9B:
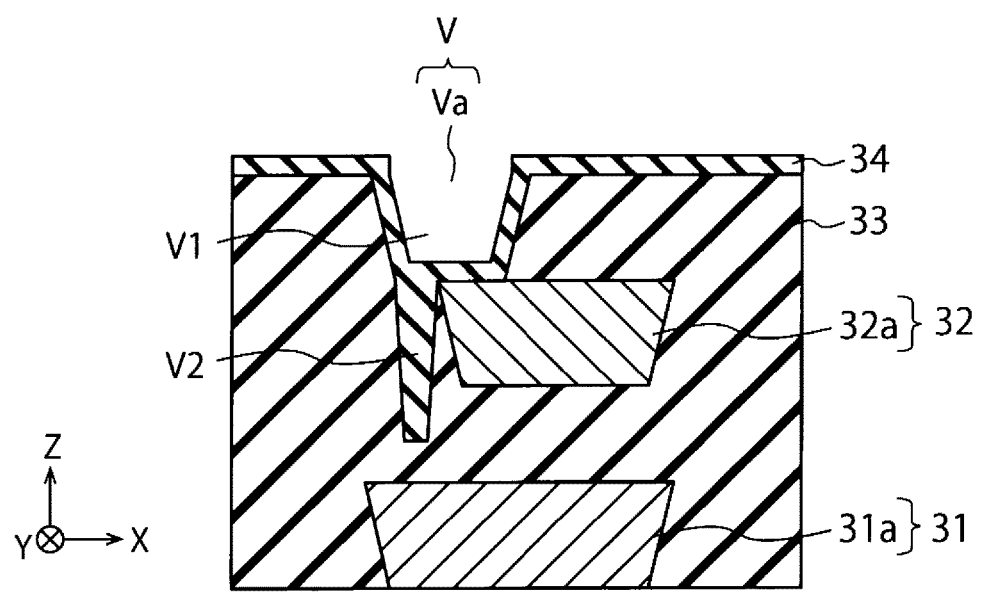

Next, the insulating film 34 is formed on the entire surface of the substrate 1 (FIG. 9B). As a result, the insulating film 34 is formed in the via hole V. The insulating film 34 may be formed of the same insulating material as at least a part of the interlayer insulating film 33, or may be formed of an insulating material different from the interlayer insulating film 33. Since the insulating film 34 of the present embodiment is formed conformally in the via hole V, the surface of the via hole V is covered with the insulating film 34, and the central portion of the via hole V remains hollow. The insulating film 34 is formed by, for example, the CVD. In the process of FIG. 9B, it is desirable to set the film thickness W2 of the insulating film 34 to a half or more of the above-described width L2 (see FIG. 8).

Figure 10A:
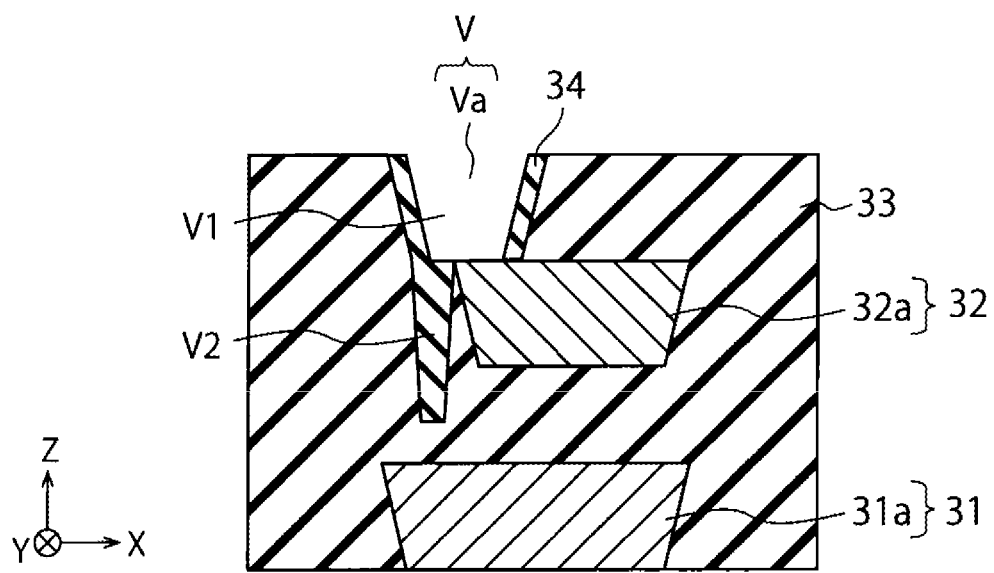
FIGS. 10A and 10B are cross-sectional views (2/2) illustrating a method of manufacturing the semiconductor device according to the second embodiment.

Next, the insulating film 34 is removed from the upper surface of the end portion of the wiring 32a (and the upper surface of the end portion of the wiring 32b (the same applies to the following)) (FIG. 10A). As a result, the upper surface of the end portion of the wiring 32a is exposed in the via hole Va. The insulating film 34 is removed by, for example, the RIE.

Figure 10B:
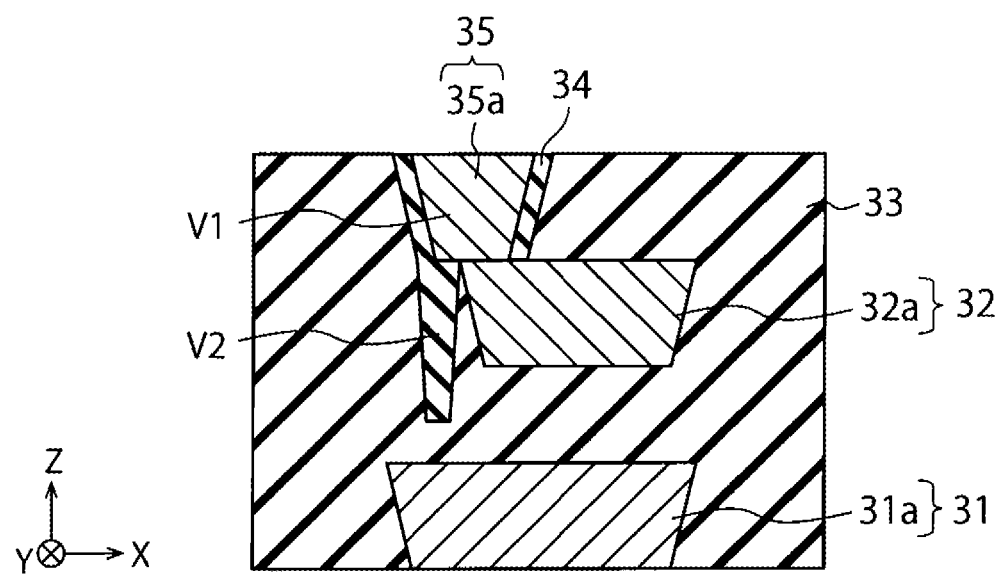

Next, via plugs 35 are formed in the individual via holes V (FIG. 10B). FIG. 10B illustrates a via plug 35a which is formed in the via hole Va via the insulating film 34. The via plug 35a is formed on the upper surface of the end portion of the wiring 32a, and is electrically connected to the wiring 32a. Further, the via plug 35a is electrically insulated from the wiring 31a by the insulating film 34. Each via plug 35 is formed of, for example, a barrier metal layer such as a titanium nitride film and a plug material layer such as a tungsten layer.

Thereafter, various wiring layers and interlayer insulating films are formed on the substrate 1. Thus, the semiconductor device of the present embodiment is manufactured.

As described above, in the present embodiment, the via plug 35 is formed in the via hole V via the insulating film 34. Therefore, according to the present embodiment, it is possible to reduce defects of the via plug 35 such as open defects, leak defects, and insufficient withstand voltage.

Meanwhile, the via holes V and the via plugs 35 of the present embodiment are also applicable to semiconductor devices other than a three-dimensional memory. Further, the recess described in FIG. 6 may also be generated on the upper surface of the wirings 32a and 32b of the present embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a first wiring layer, provided above the substrate, that extends along a first direction;
   a second wiring layer, provided above the first wiring layer, that extends along the first direction, wherein the first wiring layer includes an extended portion extending beyond an end portion of the second wiring layer along the first direction;
   a first insulating film provided on the first and second wiring layers;
   a second insulating film extending into the first insulating film; and
   a plug, extending into the first insulating film, that is electrically connected to the second wiring layer,
   wherein the second insulating film includes: a first portion above an upper surface of the end portion of the second wiring layer; and a second portion below the upper surface, and wherein the plug is surrounded by and in contact with the first portion.

2. The semiconductor device according to claim 1, wherein the plug is electrically connected to the second wiring layer via at least the upper surface of the end portion and is electrically insulated from the first wiring layer via at least the second portion of the second insulating film.

3. The semiconductor device according to claim 1, wherein the second portion is provided along a side surface of the end portion of the second wiring layer.

4. The semiconductor device according to claim 1, wherein the second portion is in contact with an upper surface of the first wiring layer.

5. The semiconductor device according to claim 1, wherein the second portion is provided at the extended portion of the first wiring layer.

6. The semiconductor device according to claim 1, wherein a film thickness of the second insulating film is ½ or more of a width of the second portion at a height of the upper surface of the end portion of the second wiring layer.

7. A method of manufacturing a semiconductor device, the method comprising:
   forming, above a substrate, a first wiring layer extending along a first direction;
   forming, above the first wiring layer, a second wiring layer extending along the first direction, wherein the first wiring layer includes an extended portion extending beyond an end portion of the second wiring layer along the first direction;
   forming a first insulating film on the first and second wiring layers;
   forming a hole in the first insulating film, the hole including a first region formed above an upper surface of the end portion of the second wiring layer, and a second region formed below the upper surface of the end portion of the second wiring layer;

forming a second insulating film in the hole, the second insulating film including a first portion formed in the first region and a second portion formed in the second region; and forming a plug in the hole, the plug formed on the upper surface of the end portion of the second wiring layer to be electrically connected to the second wiring layer;

wherein the plug is surrounded by and in contact with the first portion, the first region is covered with the second insulating film, and the second region is embedded with the second insulating film.

8. The method according to claim 7, wherein forming a hole further comprises:

exposing, by the first region of the hole, at least one side surface of the first insulating film, and, by the second region of the hole, at least a side surface of the end portion of the second wiring layer.

9. The method according to claim 7, wherein the second insulating film is a conformal layer in the hole.

10. The method according to claim 7, wherein the plug is electrically insulated from the first wiring layer via at least the second portion of the second insulating film.

11. The method according to claim 7, wherein a film thickness of the second insulating film is ½ or more of a width of the second portion at a height of the upper surface of the end portion of the second wiring layer.

* * * * *